(12) United States Patent
Veres et al.

(10) Patent No.: US 8,486,607 B2
(45) Date of Patent: *Jul. 16, 2013

(54) METHOD OF MAKING A RELIEF IMAGE

(75) Inventors: Janos Veres, Pittsford, NY (US); Kurt M. Sanger, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/350,848

(22) Filed: Jan. 16, 2012

(65) Prior Publication Data

US 2012/0118182 A1    May 17, 2012

Related U.S. Application Data

(62) Division of application No. 12/327,937, filed on Dec. 4, 2008, now Pat. No. 8,153,347.

(51) Int. Cl.
*G03F 7/26* (2006.01)
*B41N 1/06* (2006.01)
*B41N 1/16* (2006.01)

(52) U.S. Cl.
USPC ......... 430/306; 101/463.1; 430/300; 430/302

(58) Field of Classification Search
USPC ............... 101/453, 463.1; 430/300, 302, 306
See application file for complete search history.

(56) References Cited

U.S. PATENT DOCUMENTS

| | | | |
|---|---|---|---|
| 4,770,739 A | 9/1988 | Orvek et al. | |
| 5,262,275 A | 11/1993 | Fan | |
| 5,455,145 A | 10/1995 | Tarumoto | |
| 5,703,310 A | 12/1997 | Kurakake et al. | |
| 5,719,009 A | 2/1998 | Fan | |
| 5,840,463 A | 11/1998 | Blanchet-Fincher | |
| 6,020,108 A | 2/2000 | Goffing et al. | |
| 6,037,102 A | 3/2000 | Loerzer et al. | |
| 6,238,837 B1 | 5/2001 | Fan | |
| 6,312,872 B1 | 11/2001 | Murphy et al. | |
| 6,367,381 B1 | 4/2002 | Kanga | |
| 6,383,692 B1 | 5/2002 | Leenders et al. | |
| 6,759,175 B2 | 7/2004 | Daems et al. | |
| 6,931,992 B1 | 8/2005 | Hull et al. | |
| 7,029,099 B2 | 4/2006 | Lebens et al. | |
| 7,279,254 B2 | 10/2007 | Zwadlo | |
| 8,153,347 B2 * | 4/2012 | Veres et al. ............... | 430/273.1 |
| 2001/0038975 A1 | 11/2001 | Daems et al. | |
| 2002/0164495 A1 | 11/2002 | Sweet et al. | |
| 2004/0197706 A1 | 10/2004 | Wada et al. | |
| 2005/0227182 A1 | 10/2005 | Ali et al. | |
| 2006/0154180 A1 | 7/2006 | Kannurpatti | |

FOREIGN PATENT DOCUMENTS

| | | |
|---|---|---|
| EP | 0 295 818 | 12/1988 |
| EP | 1070989 | 1/2001 |

OTHER PUBLICATIONS

U.S. Appl. No. 12/183,173, filed Jul. 31, 2008, titled *System and Method of Employing Secondary Back Exposure of Flexographic Plate*, by G. Zwadlo.

U.S. Appl. No. 11/758,042, filed Jun. 5, 2007, titled *Mask Film to Form Relief Images and Method of Use*, by G. Zwadlo et al.

* cited by examiner

*Primary Examiner* — Anca Eoff
(74) *Attorney, Agent, or Firm* — J. Lanny Tucker

(57) ABSTRACT

A relief (or flexographic) printing precursor has first and second radiation-sensitive layers, or a plurality of radiation-sensitive layers. The first radiation-sensitive layer is sensitive to a first imaging radiation having a first $\lambda_{max}$. The second radiation-sensitive layer is disposed on the first radiation-sensitive layer and is sensitive to a second imaging radiation having a second $\lambda_{max}$ that differs from the first $\lambda_{max}$ by at least 25 nm. An infrared radiation ablatable layer can be present and is opaque or insensitive to the first and second imaging radiations and contains an infrared radiation absorbing compound. These relief printing precursors can be used to prepare flexographic printing plates, cylinders, or sleeves where the ablatable layer is used to form an integral mask on the element. Use of the invention provides a relief image without any loss in the strength of the small dots and can be carried out using multiple irradiation steps using the same apparatus.

14 Claims, 15 Drawing Sheets

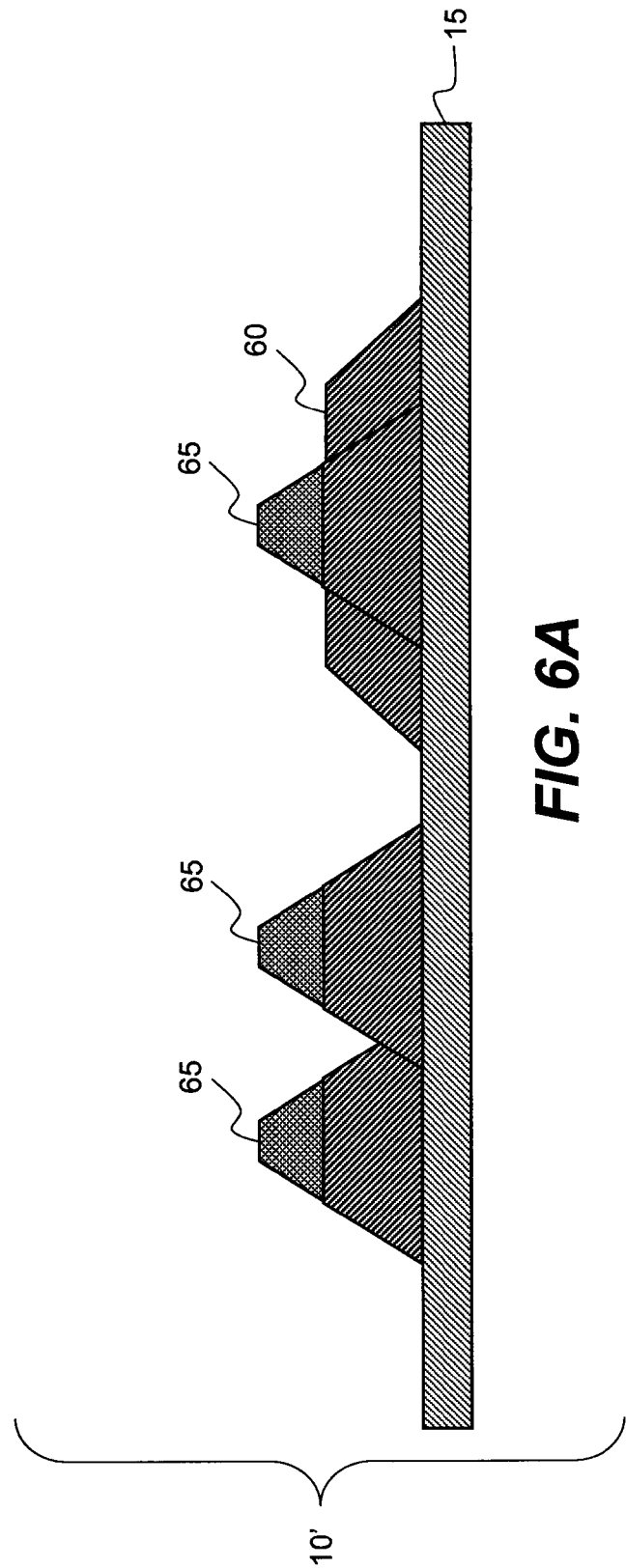

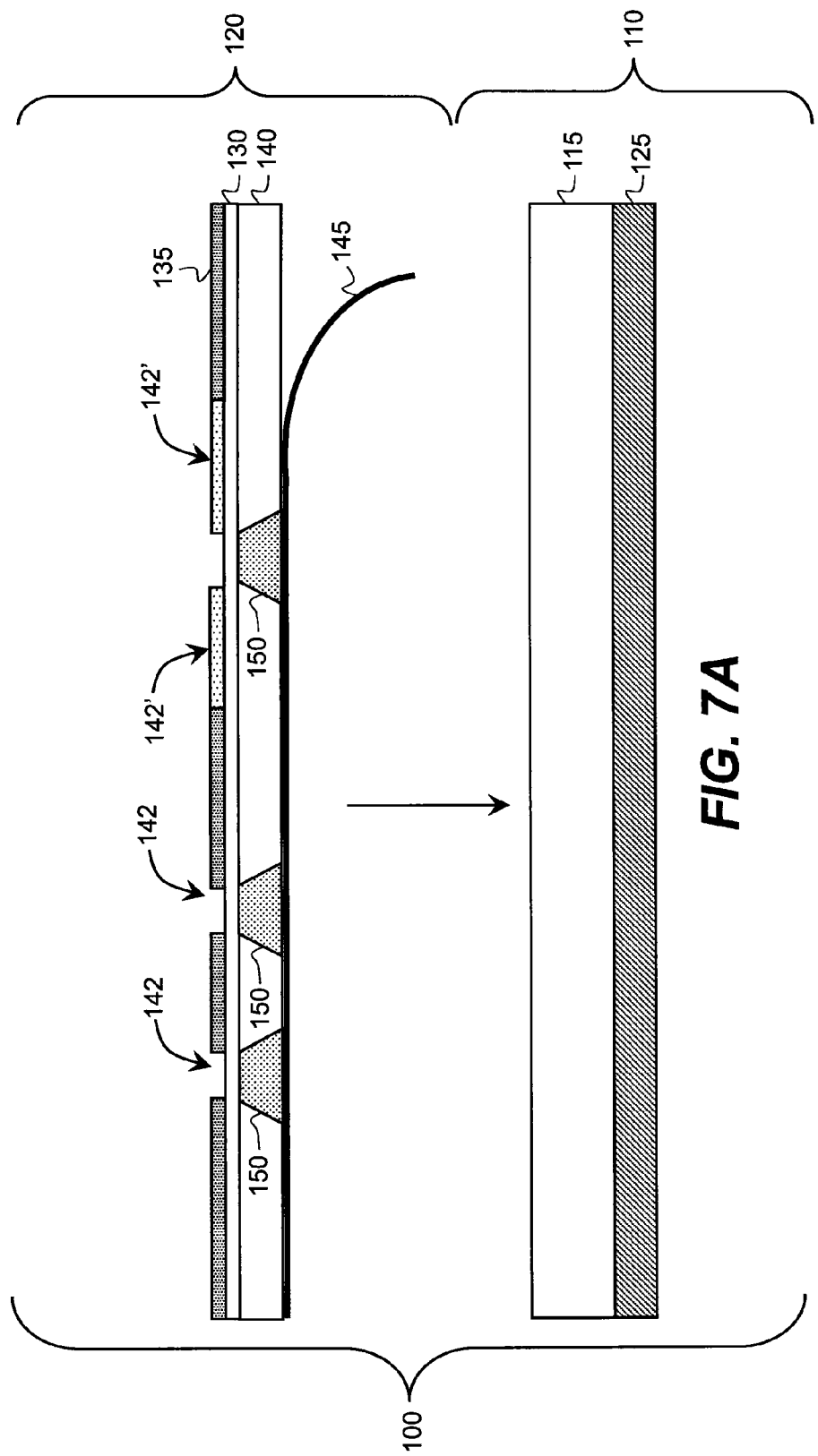

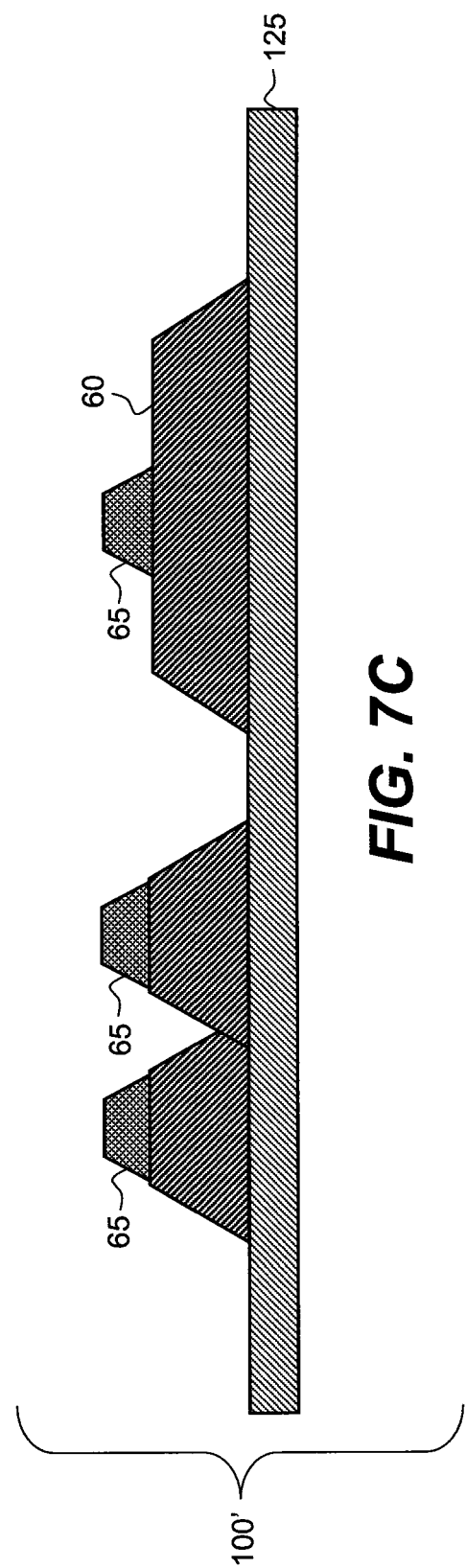

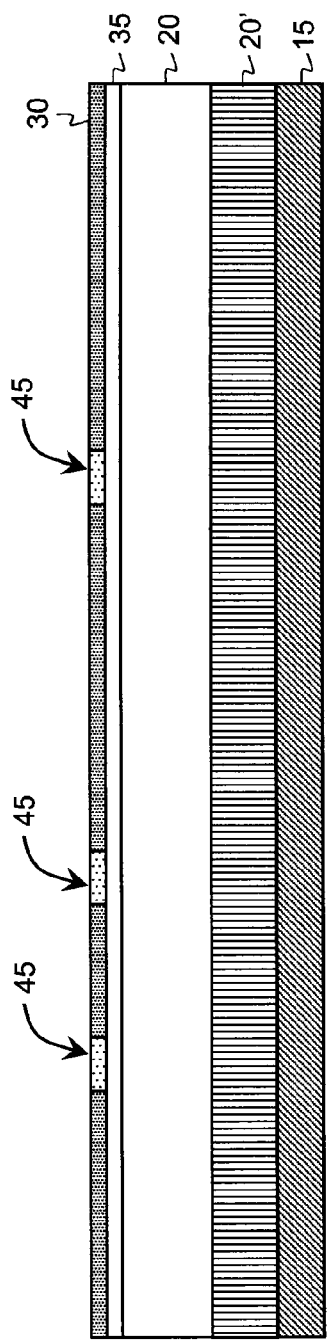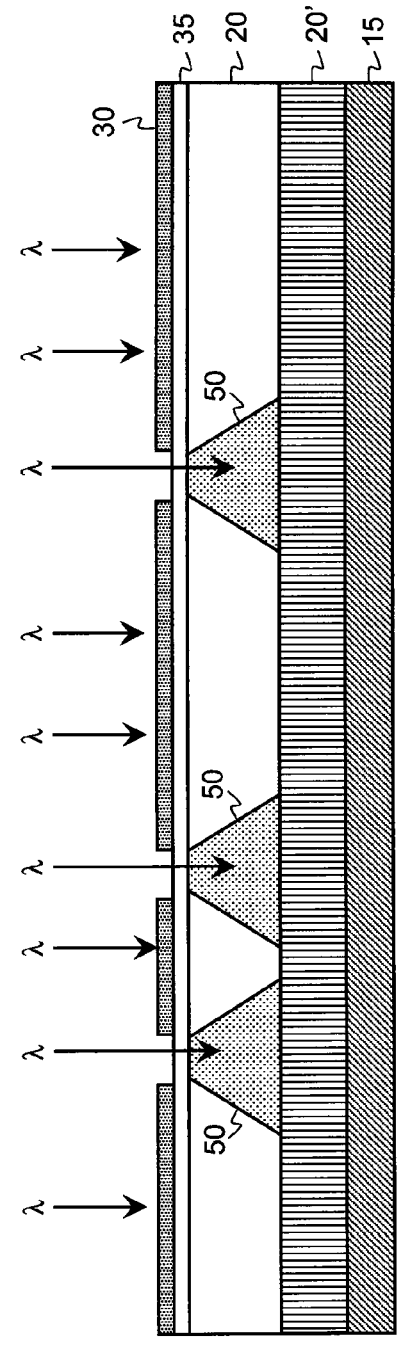
FIGS. 9A (PRIOR ART)
FIGS. 9B (PRIOR ART)

(PRIOR ART FINAL ARTICLE)

(INVENTION FINAL ARTICLE)

METHOD OF MAKING A RELIEF IMAGE

RELATED APPLICATION

This is a divisional application of U.S. Ser. No. 12/327,937, filed Dec. 4, 2008, by Veres et al., now issued as U.S. Pat. No. 8,153,347 on Apr. 10, 2012.

FIELD OF THE INVENTION

This invention is directed to a method for using flexographic elements (or relief printing elements or precursors) to make relief images by laminating two separate units.

BACKGROUND OF THE INVENTION

Flexographic printing is a method of direct rotary printing that uses a resilient relief image in a plate of rubber or photopolymer to print articles such as cartons, bags, labels, or books. Flexographic printing has found particular application in packaging, where it has displaced photogravure and offset lithography printing techniques in many cases.

Many methods of forming relief images are known in the graphic arts. Generally, photosensitive elements comprising an ablatable mask layer over a photosensitive polymer layer can be made into articles bearing relief images without the use of a photographic negative (graphic arts film) or other separate masking device. These photosensitive elements are formed into relief images by first imagewise exposing the element with laser radiation (generally infrared radiation directed by a computer) to selectively remove the mask layer in the exposed areas, and then overall exposing the element with actinic radiation (typically UV radiation) to cure the photosensitive layer in the non-masked areas. The remaining areas of the mask layer and the non-hardened portions of the photosensitive layer are then removed by one or more liquid developing processes.

Examples of flexographic printing precursors are described for example in U.S. Pat No. 5,262,275 (Fan), U.S. Pat. No. 5,703,310 (Van Zoeren), U.S. Pat. No. 5,719,009 (Fan), U.S. Pat. No. 6,020,108 (Goffing et al.), U.S. Pat. No. 6,037,102 (Loerzer et al.), U.S. Pat. No. 6,238,837 (Fan), and U.S. Pat. No. 6,759,175 (Daems et al.) and in EP 0295818 (Cusdin).

Commercial flexographic printing precursors can be prepared from Kodak Flexcel® NX Plate that is used with Kodak Flexcel® NX Thermal media and that is from Eastman Kodak Company and Cyrel® Digital Flexo Plate that is available from DuPont.

U.S. Pat. No. 7,279,254 (Zwadlo) describes a method for making an article with a relief image using a removable film.

Other flexographic printing elements are described in U.S. Patent Application Publication 2005/0227182 (Ali et al.) and in copending and commonly assigned U.S. Ser. No. 11/758, 042 (filed Jun. 5, 2007 by Zwadlo, Brown, Fohrenkamm, and Stolt) that describes a masking film and method of using it to improve the relief image.

Flexographic printing elements having integral mask layers (that is, ablatable layers) generally require the use of a high-powered laser-equipped imaging that is specifically configured for imaging such elements. In some instances, multiple machines may be needed to vary the thickness of the relief image.

While the quality of articles printed using flexographic elements has improved significantly in recent years, physical limitations related to the process of creating a relief image in the flexographic printing plate remain. For example, it is very difficult to print small graphic elements such as fine dots, lines, and even text using flexographic printing elements. The density of the image is represented by the total area of the various-sized dots in a halftone screen representation of a continuous tone image. In the lightest areas of an image (commonly referred to as highlights), the dots need to become very small. In the traditional flexographic imaging process, the small dots are generally limited to 4%. Due to the nature of the plate making processes, maintaining small dots on a flexographic printing plate is very difficult. In a pre-imaging (or post-imaging) step, the floor of the relief image is set by area exposure to ultraviolet light from the back of the printing element. This exposure hardens the photopolymer to a desired relief depth for optimal printing. Floodwise exposure to image-forming radiation via a mask layer followed by a processing step to remove unhardened (that is, unexposed) photopolymer produces relief dots having generally conical shape.

The smallest of these dots are sometimes removed during processing, which means that no ink is transferred to those areas during printing (the dot is not "held" on the plate or press). Alternatively, even if the smallest dots survive processing, they are susceptible to damage on the rotary printer, as small dots often fold over or partially break off during printing causing either excess ink or no ink to be transferred during printing.

Copending and commonly assigned U.S. Ser. No. 12/183, 173 (filed Jul. 31, 2008 by Zwadlo) describes making a relief image on a flexographic printing plate using selective backside exposure to curing radiation. This allows the formation of highlight dots down to 0.8%.

SUMMARY OF THE INVENTION

This invention provides a relief printing precursor comprising at least:

a first radiation-sensitive layer that is sensitive to a first imaging radiation comprising a first $\lambda_{max}$, a second radiation-sensitive layer disposed on the first radiation-sensitive layer, the second radiation-sensitive layer being sensitive to a second imaging radiation comprising a second $\lambda_{max}$ that differs from the first $\lambda_{max}$ by at least 25 nm, and an infrared radiation ablatable layer disposed over the second radiation-sensitive layer, the ablatable layer being opaque to the first and second imaging radiations and comprising an infrared radiation absorbing compound.

In some embodiments of this invention, a relief printing precursor comprises two or more radiation-sensitive layers comprising, at least:

a first radiation-sensitive layer that is sensitive to a first imaging radiation comprising a first $\lambda_{max}$, and a second radiation-sensitive layer disposed on the first radiation-sensitive layer, the second radiation-sensitive layer being sensitive to a second imaging radiation comprising a second $\lambda_{max}$ that differs from the first $\lambda_{max}$ by at least 25 nm.

This invention also provides a method of making a relief printing image comprising the steps of:

A) imagewise exposing a relief printing precursor described above to infrared radiation ablative energy to form a mask image in the infrared radiation ablatable layer, B) subsequently or simultaneously with step A, exposing the relief printing precursor to a second imaging radiation through the mask image, and C) modifying the mask image using additional infrared radiation ablative energy to form a modified mask image.

In some embodiments, the method includes after step C, an additional step:

D) subsequently exposing the relief printing precursor to a first imaging radiation through the modified mask image.

Further, this invention provides a relief printing system comprising:

a) a first unit comprising a first radiation-sensitive layer that is sensitive to a first imaging radiation comprising a first $\lambda_{max}$, and b) a second unit comprising a second radiation-sensitive layer that is sensitive to a second imaging radiation comprising a second $\lambda_{max}$ that differs from the first $\lambda_{max}$ by at least 25 nm, and an infrared radiation ablatable layer disposed on the second radiation-sensitive layer, the ablatable layer being opaque to the first and second imaging radiations and comprising an infrared radiation absorbing compound.

This invention also provides a relief printing precursor comprising:

two or more radiation-sensitive layers having different radiation sensitivities, and an infrared radiation ablatable layer that is opaque to imaging radiation to which the two or more radiation-sensitive layers are responsive.

In some embodiments, these precursors are self-supporting and one of the radiation-sensitive layers is capable of being cured to provide a substrate.

In other embodiments, the precursor further comprises a transparent substrate and the infrared radiation ablatable layer is on the opposite side of the substrate from the two or more radiation-sensitive layers.

Still again, a method of making a relief printing image comprises the following steps:

A'. imagewise exposing the relief printing precursor described above to infrared radiation ablative energy to form or modify a mask image in the infrared radiation ablatable layer, and B.' exposing the relief printing precursor through the mask image using radiation to which at least one of the radiation-sensitive layers is sensitive,.

Steps A' and B' can repeated in sequence at least once, and in some embodiments, each B' step can be carried out using different wavelengths.

In addition, this invention provides a relief printing precursor comprising two or more radiation-sensitive layers comprising, at least:

a first radiation-sensitive layer that is sensitive to a first imaging radiation comprising a first $\lambda_{max}$, and a second radiation-sensitive layer disposed on the first radiation-sensitive layer, the second radiation-sensitive layer being sensitive to a second imaging radiation comprising a second $\lambda_{max}$ that differs from said first $\lambda_{max}$ by at least 25 nm.

This relief printing precursor can further comprise an infrared radiation ablatable layer disposed on the second radiation-sensitive layer, the infrared radiation ablatable layer being opaque to the first and second imaging radiations and comprising an infrared radiation absorbing compound.

Applicants have discovered a way to prepare a relief image without any loss in the strength of the small dots in that relief image. With the present invention, they can selectively control the relief image floor using a second frontside IR ablative exposure instead of a backside exposure using the same mask and exposing machine, leaving a perfectly registered relief image. In other words, a single mask layer can be used to define a relief image and floor pattern (that is multi-level pattern) by imaging from the same side using the same machine. This avoids the need to create a second mask for backside imaging. When backside exposure is used in combination with frontside exposure, a second exposing device is needed along with possibly two masks. The present invention eliminates the need for a backside mask and exposure apparatus. The relief printing precursor of this invention can be either positive- or negative-working and the substrate can be transparent or opaque since a backside exposure is not needed.

These advantages are achieved by including a second infrared radiation ablative exposure from the frontside to expand the mask for the relief image that was initially created with a first IR ablative exposure. In addition, the relief image is formed using two separate layers that differ in sensitivity by at least 25 nm. The present invention enables higher throughput for individual imaging apparatus and only a single apparatus is needed. Current commercial imaging machines, such as the Kodak® Trendsetter image setting device can be readily modified to carry out the present invention.

Because the relief printing precursor of this invention has two or more layers of different radiation sensitivity, the resulting relief image has two or more levels corresponding to the number of radiation-sensitive layers. Thus, each level in the relief image has a different composition.

BRIEF DESCRIPTION OF THE DRAWINGS

FIGS. 6A and 6B are partial cross-sectional views, not to scale, of embodiments of FIG. 5 after chemical development to remove non-crosslinked portions of the layers and to provide relief images.

FIGS. 7A and 7B are partial cross-sectional views, not to scale, of an embodiment of a relief printing system of this invention having first and second units that can be laminated to form a relief printing precursor.

FIG. 7C is a partial cross-sectional view, not to scale, of the embodiments of FIGS. 7A and 7B after chemical development to remove non-crosslinked portions of the layers and to provide a relief image.

FIGS. 8A, 8B, 9A, 9B, and 10A are partial cross-sectional views, not to scale, of a method of the prior art for providing a relief printing element.

DETAILED DESCRIPTION OF THE INVENTION

Unless otherwise indicated, the relief printing precursor described herein is an embodiment of this invention, and can be in the form of a sheet, plate, cylinder, sleeve, tape, web, or any other shape that can be used for providing a relief image.

Unless otherwise indicated, all percentages are by weight.

By "ablative" or "infrared radiation ablatable layer", we mean that the layer can be imaged using a thermal ablative means such as IR laser radiation that causes rapid local changes in the imageable layer thereby causing the layer material(s) to be vaporized or ejected from that layer.

Useful embodiments of the relief printing precursor and a method for its use can be understood by reference to FIGS. 1-7, and further details about compositions of layers are provided below.

Figure 1:
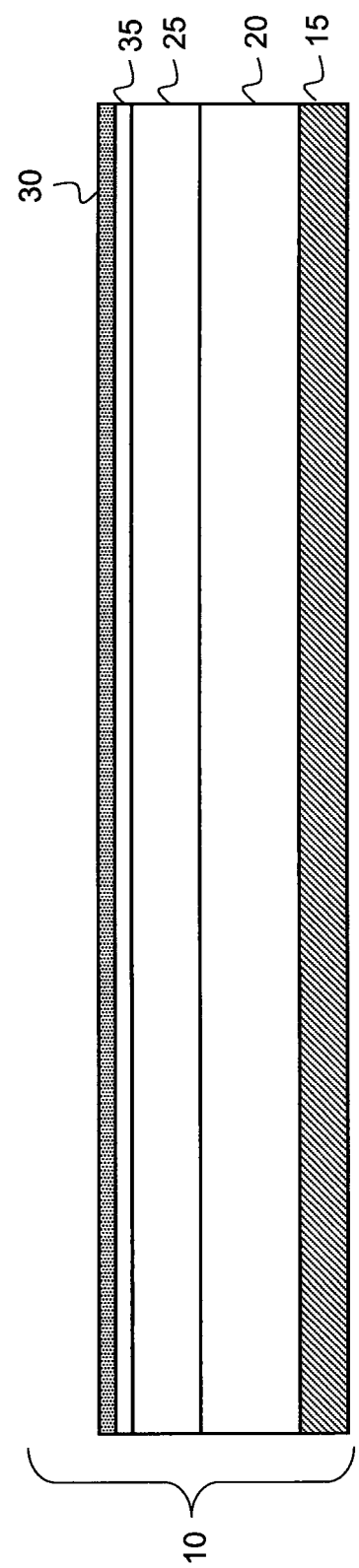
FIG. 1 is a partial cross-sectional view, not to scale, of a relief printing precursor of this invention, showing its various layers.

Referring to FIG. 1, relief printing precursor 10 includes substrate 15 having disposed thereon first radiation-sensitive layer 20, second radiation-sensitive layer 25, infrared radiation ablatable layer 30, and optional oxygen inhibition layer 35.

Figure 2:
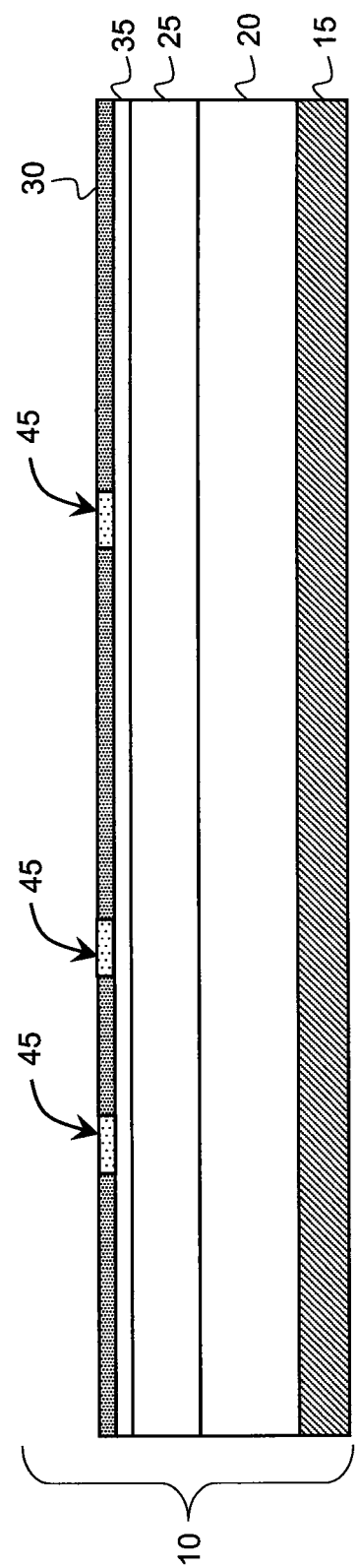
FIG. 2 is a partial cross-sectional view, not to scale, of the embodiment of FIG. 1 after the mask has been initially formed by laser ablation in the infrared radiation ablatable layer.

Referring to FIG. 2, relief printing precursor 10 can be irradiated with infrared radiation ablative energy (not shown), for example, using an infrared radiation laser that is commercially available, to provide an integral mask so that image areas 45 are removed from infrared radiation ablatable layer 30. The integral mask can be formed, for example, using a Kodak® Trendsetter plate setter (Eastman Kodak Company, Vancouver, Calif.). During formation of the mask, little or no changes occur in the underlying layers. This laser ablative step can be carried out with the noted apparatus or other known apparatus, for example, at an exposure energy of at least 150 and up to 2000 mJ/cm². Exposure is usually carried out for at least 2 and up to 6 minutes. The image can be supplied by digital signals from a suitable computer that has the desired image stored in suitable digital form.

Figure 3A:
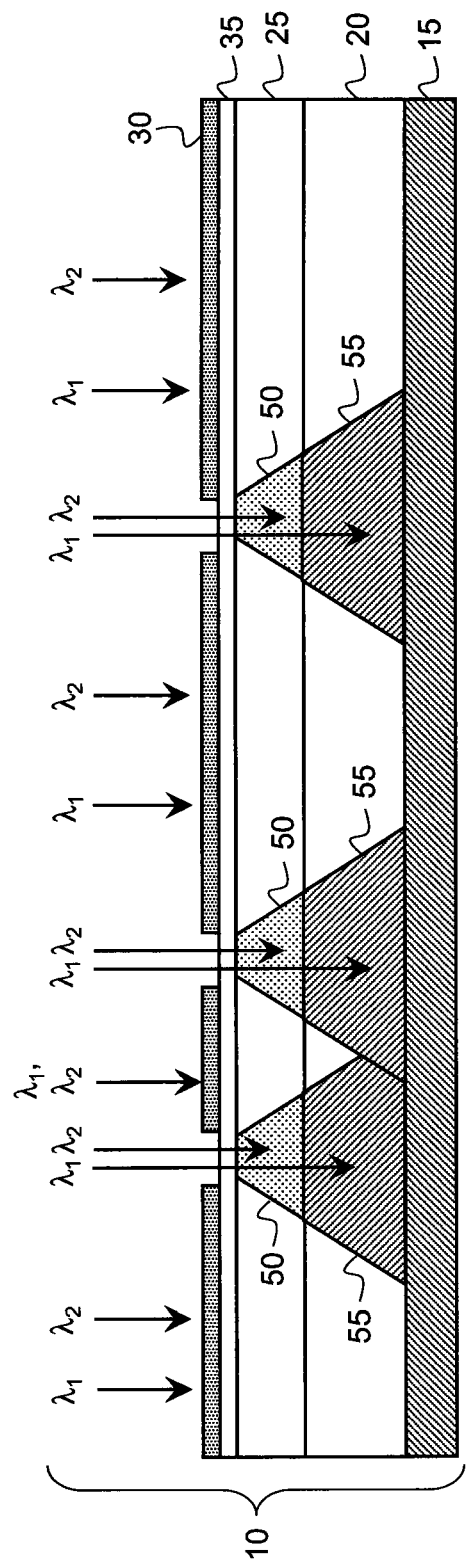
FIG. 3A is a partial cross-sectional view, not to scale, of the embodiment of FIG. 2 after exposure to the second imaging radiation and optionally exposure to the first imaging radiation at the same time.
Figure 3B:
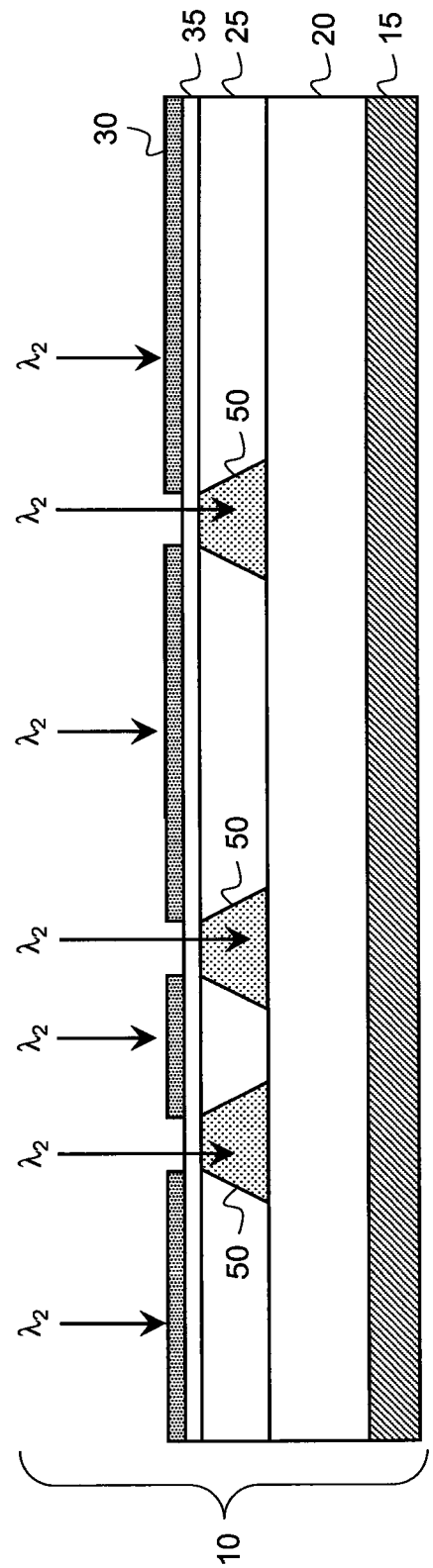
FIG. 3B is a partial cross-sectional view, not to scale, of the embodiment of FIG. 2 after exposure to the second imaging radiation only.

FIGS. 3A and 3B show the effect of irradiation of relief printing precursor 10 with a second imaging radiation ($\lambda_2$) that includes radiation that is typically in the UV to visible region of the electromagnetic spectrum (for example, from about 250 to about 750 nm or UV only of from about 290 to about 320 nm). This irradiation can occur simultaneously with or subsequently to the laser ablation operation described above. In some embodiments, the second imaging radiation is in the near-IR to IR regions of from about 750 to about 1400 nm or typically from about 750 to about 1200 nm. The second radiation-sensitive layer 25 is sensitive to this second imaging radiation that crosslinks, "cures", coalesces, or otherwise hardens the irradiated portions 50 of that layer. This irradiation can be provided from any suitable source such as a fluorescent lamp, JDSU Diode Laser (830 nm) Fiber-Coupled 2.0 W (2486-L3 Series), or Nichia UV LED model NCSUO34A(T) (385 nm), or Nichia UV LED model NCSUO33A(T) (365 nm), or Roithner UV LED model UVTOP255-FW-TO39 (255 nm). Roithner has 255-380 nm UV LEDs available and Phoseon Technology's RX Starfire MAX UV Light System using UV LED Array 380-420 nm can be used. Philips TL-80W is a UVA bulb radiating at 365 nm, and Philips TUV-36W is a UVC bulb radiating at 254 nm.

Optionally, flexographic precursor 10 (FIG. 3A) can be simultaneously or sequentially irradiated with a first imaging radiation ($\lambda_1$) to which second radiation-sensitive layer is insensitive but to which first radiation-sensitive layer 20 is sensitive to provide crosslinked, "cured", coalesced, or otherwise hardened regions 55. Thus, the irradiation of these layers may be over a broad range of wavelengths (such as a broadband lamp) so that both first and second imaging radiation ($\lambda_1+\lambda_2$) occur at the same time. In some embodiments, such an irradiation source can be fitted into an existing IR-imaging apparatus so that the same apparatus can be used for both ablation and irradiation of the underlying layers. For example, a Kodak® Trendsetter plate setter can be modified in this manner.

Optionally, relief printing precursor 10 may contain first radiation sensitive layer 20 that is sensitized to both the first imaging radiation $\lambda_1$ and second imaging radiation $\lambda_2$ such that the step of exposing the second radiation layer 25 to the second imaging radiation $\lambda_2$ creates crosslinked, cured, coalesced, or otherwise hardened irradiated portions 50 (that will be inked during printing) and also provides crosslinking or curing of irradiated portions 55.

FIG. 3B shows the option of irradiating relief printing precursor 10 with second imaging radiation $\lambda_2$ only This imaging of the second radiation-sensitive layer can be carried out using the noted imaging radiation source for at exposure energy of at least 100 mJ/cm² and up to and including 5 J/cm². The time of exposure would be readily determined depending upon the particular apparatus and irradiation sources being used. As noted above, this irradiation can occur at the same time as the laser ablation step and thus, the time for both steps would be the same.

Figure 4:
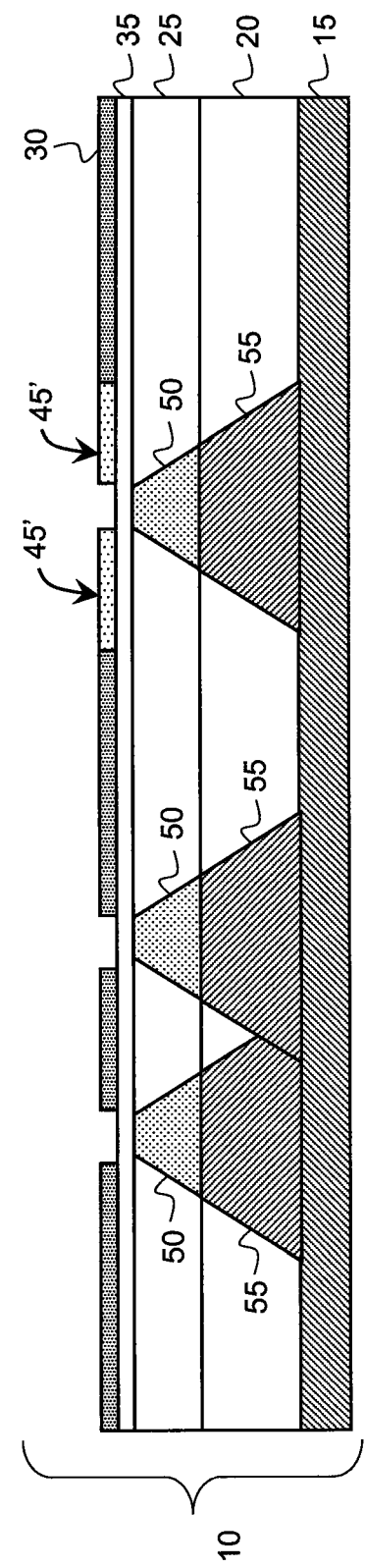
FIG. 4 is a partial cross-sectional view, not to scale, of the embodiment of FIGS. 3A and 3B after a second laser ablation step to enlarge the mask.

FIG. 4 shows that a second laser ablation of infrared radiation ablatable layer 30 in relief printing precursor 10 provides a modified or expanded mask, for example in image area 45'. The user can be selective as to the parts of the mask to be modified, for example, choosing to modify only those image areas in the mask that will provide smaller image dots. Alternatively, the user may modify only those areas in the mask adjacent to edges of the image where there are no adjacent half-tone dots. One skilled in the art would readily recognize other areas in the element where it would be desirable to locally raise the floor of features in the printing plate (for example, features may be half-tone dots, linework, text, solid areas, solid printed areas or any other imageable area). Ablative energy for this step can be at least 150 mJ/cm² and up to 2 J/cm² for at least 2 minutes and up to 6 minutes.

Figure 5:
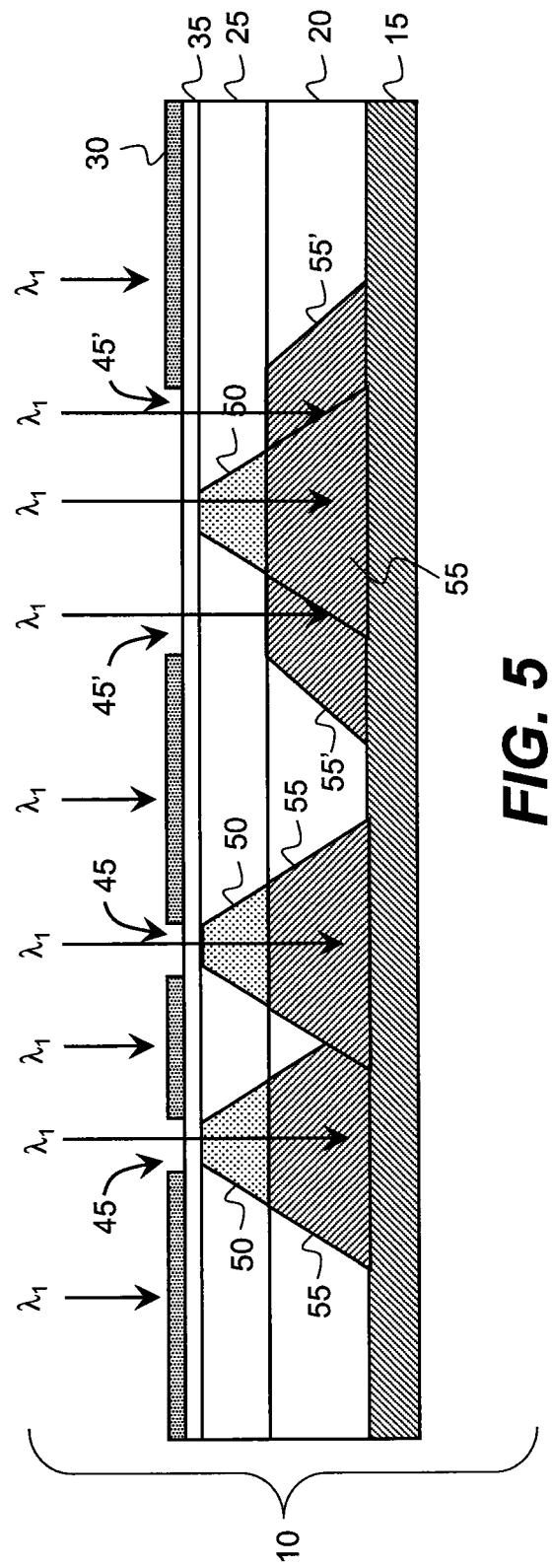
FIG. 5 is a partial cross-sectional view, not to scale, of the embodiment of FIG. 4 after exposure to the first imaging radiation to enlarge the relief floor.

Once the second laser ablation is carried out, relief printing precursor 10 can be irradiated with first imaging radiation ($\lambda_1$) to further crosslink, cure, coalesce, or otherwise harden first radiation-sensitive layer 20 to expand the cured regions 55, and to form new regions 55' (see FIG. 5). As noted above, in some embodiments, there may be no previous curing of first radiation-sensitive layer 20, and this may be the first time in the process that it is irradiated with curing radiation that differs from the second imaging radiation by at least 25 nm. For example, the first imaging radiation can be generally in the UV to visible range of from about 250 to about 750 nm or typically from about 290 to about 400 nm. This irradiation step is used to strengthen or expand the "floor" of the eventual relief image by curing more of first radiation-sensitive layer 20 in new regions 55' through modified mask area 45'. The first imaging radiation can be carried out for at least 1 and up to 20 minutes (for example from about 4 to about 20 minutes) at exposure energy of at least 2 J/cm² and up to and including 50 J/cm².

If desired, a backside exposure (not shown) can be carried out at this point using the first radiation through substrate 15 to raise the relief image floor. This exposure can be, for example, for 20 seconds at 376 mJ/cm².

In many embodiments, the second radiation-sensitive layer is opaque, transparent, or insensitive to the first imaging radiation. The first and second imaging radiations can have overlapping wavelengths as long as their $\lambda_{max}$ values differ by at least 25 nm. In other embodiments, the $\lambda_{max}$ values are different but the first and second imaging radiations do not have overlapping wavelengths. The first radiation-sensitive layer must have sensitivity to radiation to which the second radiation-sensitive layer is not sensitive.

In FIG. 6A, the non-imaged portions of the first and second radiation-sensitive layers and the optional oxygen inhibition layer have been washed off in chemical processing or development to provide relief printing element 10', having a relief image shown by raised image areas 65 and local floor 60 on substrate 15. It should be understood however, that such elements need not have a substrate but can be self supporting if the first radiation-sensitive layer is thick enough. This chemical washing or development can be carried out using the appropriate solvents that dissolve the non-imaged portions of the noted layers.

Figure 6B:
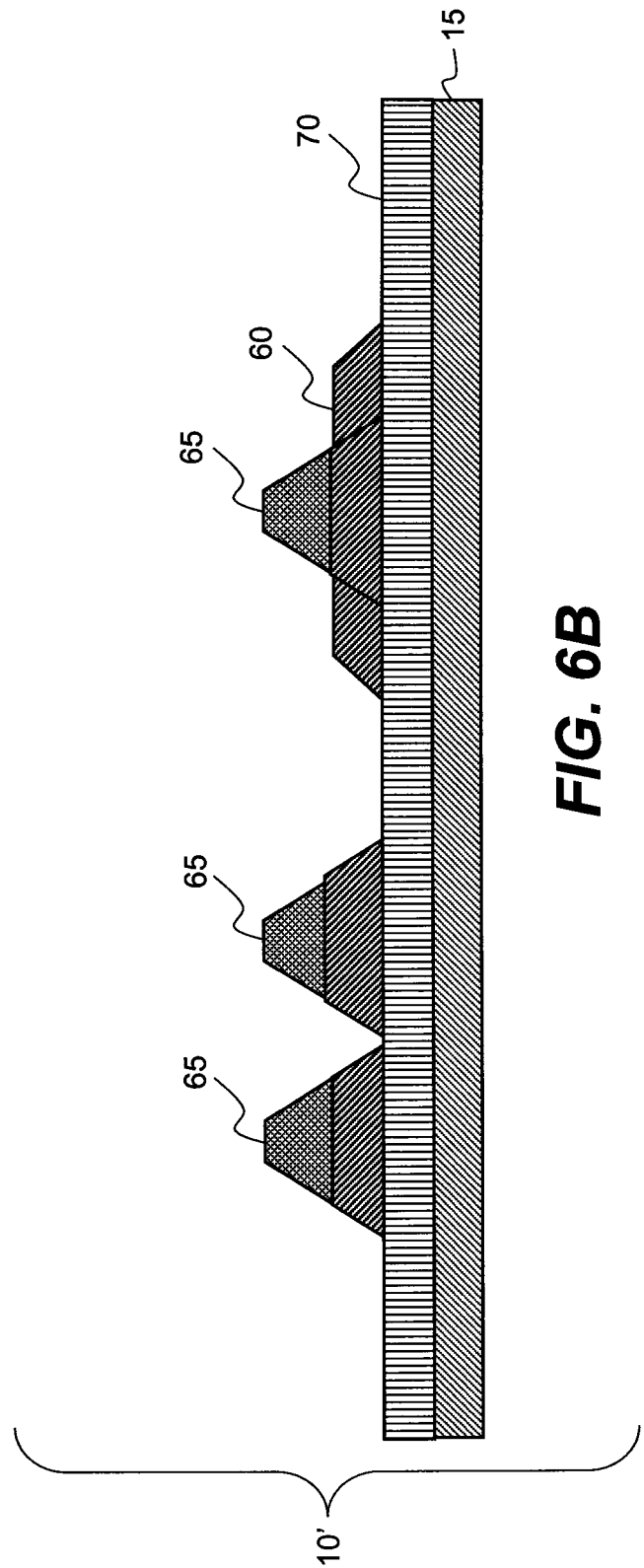

Alternatively, in FIG. 6B, relief image floor 70 of relief printing element 10' has been raised using an optional backside exposure of the first radiation-sensitive layer.

Figure 7B:
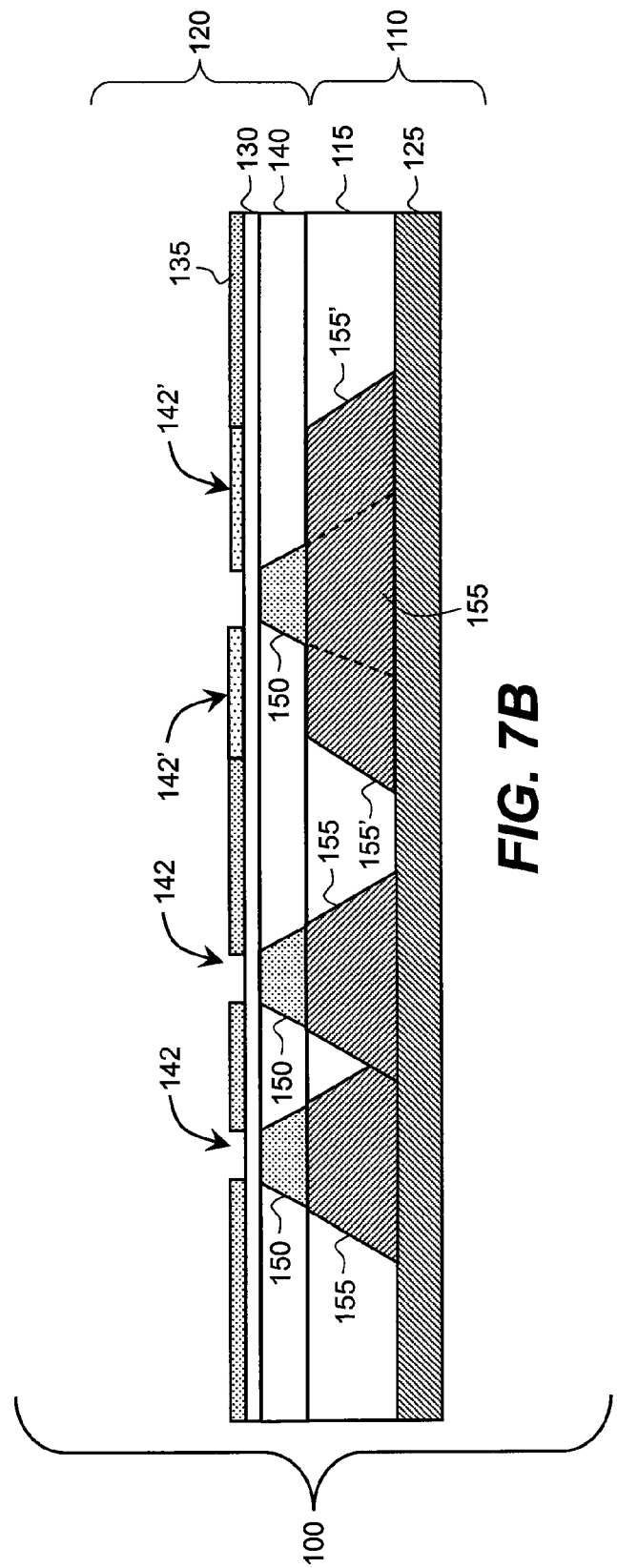

This invention also provides a relief printing assembly that is illustrated in FIGS. 7A and 7B. Relief printing assembly 100 comprises first unit 110 that comprises first radiation-sensitive layer 115 that is sensitive to a first imaging radiation comprising a first $\lambda_{max}$ as described above and optional substrate 125. Second unit 120 includes second radiation-sensitive layer 140, laser ablatable layer 135 in which a modified mask has already been formed with removed areas 142 and 142' and optional oxygen inhibition layer 130. The mask need not be already formed in every relief printing assembly of this invention (for example, ablation or mask formation can be accomplished after the two units are joined). In FIG. 7A, second radiation-sensitive layer 140 has already been irradiated with a second imaging radiation as described above to provide areas 150. In such embodiments, steps A and B of the method of this invention are carried out before the first and second units are united (which is also before step D of the method). Either or both the first and second units can be self-supporting but in the embodiment illustrated in FIG. 7A, first unit 110 has substrate 125. Optional peelable protective layer 145 can also be present to protect second unit 120 and can also serve as a substrate that is removed or peeled off after laser ablation and irradiation and before the two units are joined or united by lamination or other suitable means. For example, lamination can be carried out using a Kodak Flexel NX® Laminator (Eastman Kodak Company, Rochester, N.Y.) or a CODOR LLLP650 Laminator (Codor Laminating Systems, Amsterdam, Holland). Supports or substrates are optional for each of the first and second units shown in FIG. 7A.

For example, in FIG. 7A, second unit 120 can be irradiated with infrared radiation ablative energy (not shown) to provide a mask so that imaged areas 142 of infrared radiation ablatable layer 135 are removed. This mask formation can be accomplished, for example using a Kodak® Trendsetter plate setter. During formation of this mask, little or no change occurs in the underlying layers. They are opaque or insensitive to this ablative exposure. Second radiation-sensitive layer 140 is irradiated with a second imaging radiation (not shown) comprising $\lambda_2$ creating crosslinked or cured regions 150. Then, second unit 120 is further exposed to infrared radiation ablative energy (not shown) to modify the integral mask so some of image areas 142 are enlarged to image area 142'. An optional protective layer 145 is peeled off and then, second unit 120 is laminated to first unit 110 to form integral relief printing precursor 100. As shown in FIG. 7B, first imaging radiation comprising $\lambda_1$ is then applied to first radiation-sensitive layer 115 through the modified mask areas 142 and 142' in infrared radiation ablatable layer 135 to create enlarged crosslinked or cured regions 155 and 155' in first radiation-sensitive layer 115. A relief image with raised image areas 65 and local floor 60 on substrate 125 is provided in relief printing element 100' by chemical development (FIG. 7C).

Figure 7D:
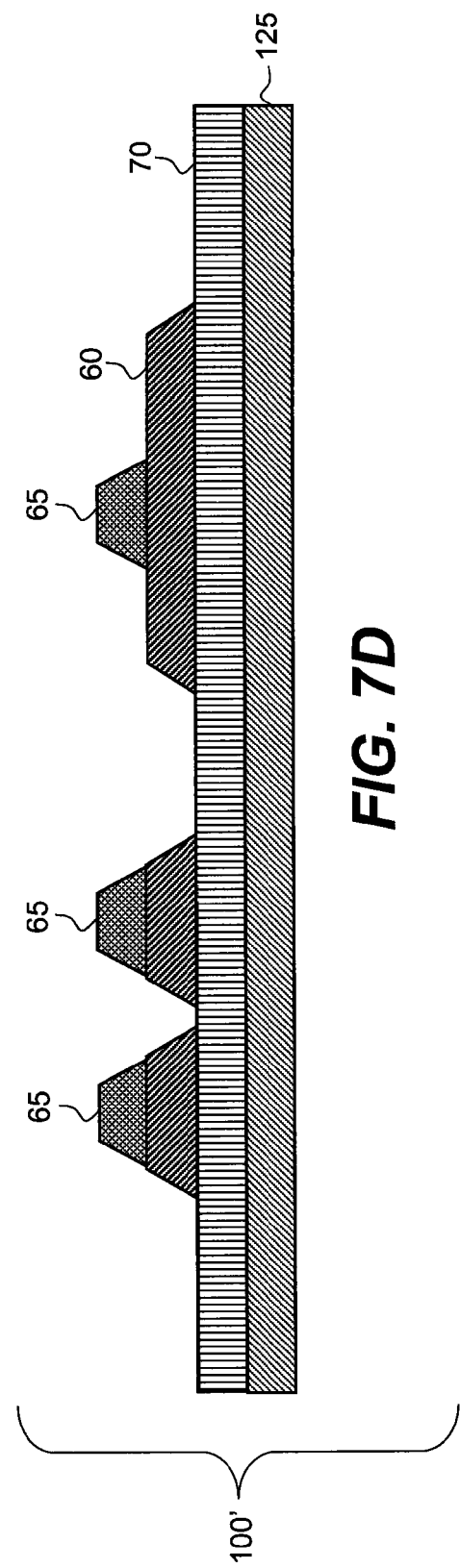
FIG. 7D shows the FIG. 7C embodiment after an optional back exposure step.
Figure 8A:
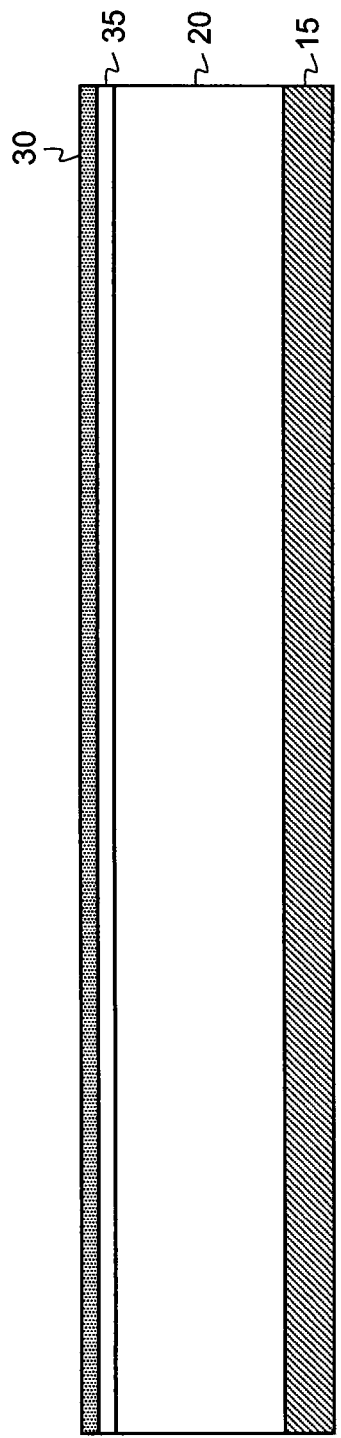
Figure 8B:
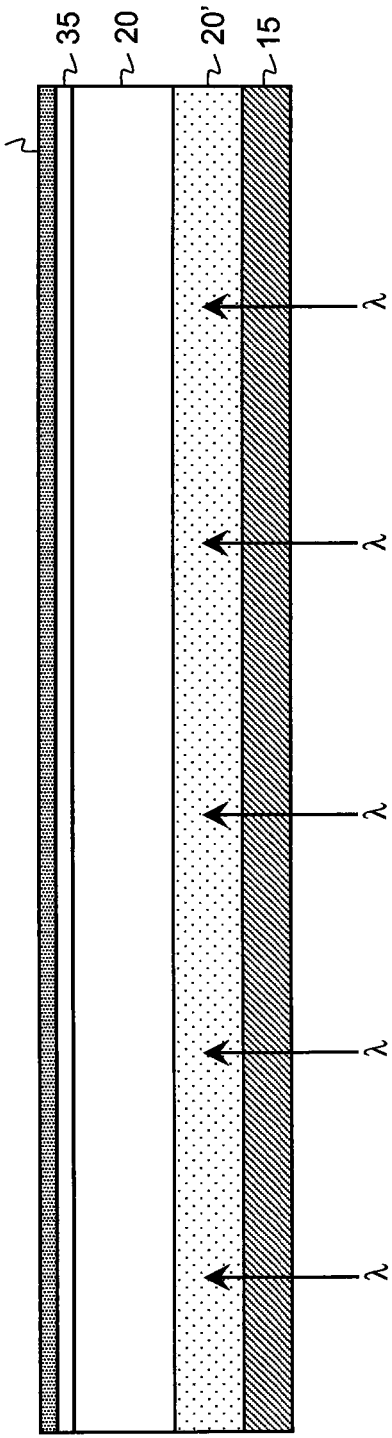

An optional back exposure step may then be performed by exposing first radiation-sensitive layer 115 to the first imaging radiation $\lambda_1$ from a UV source through substrate 125 to provide raised floor 70 in relief printing element 100' as shown after chemical development in FIG. 7D.

Figure 10A:
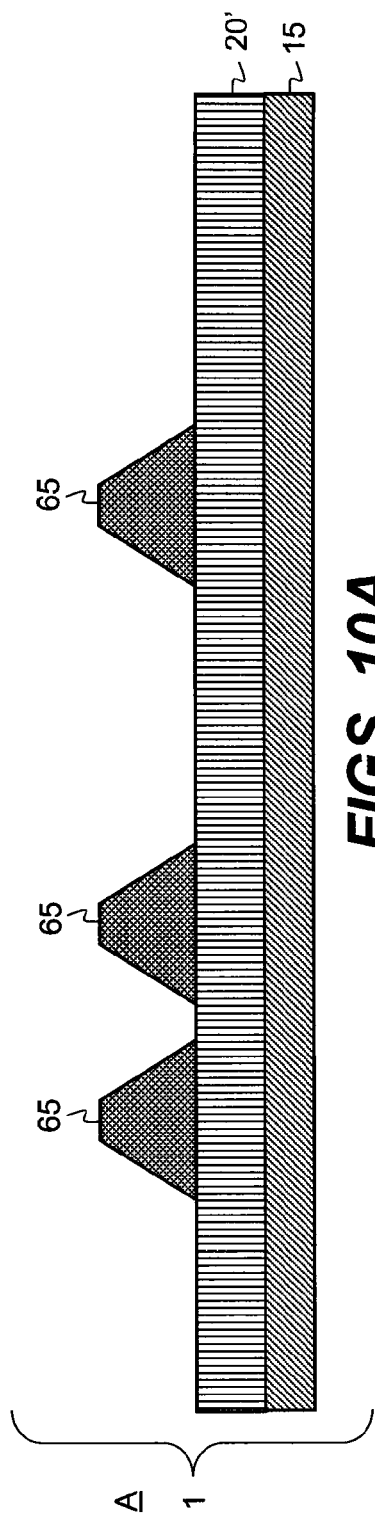
Figure 10B:
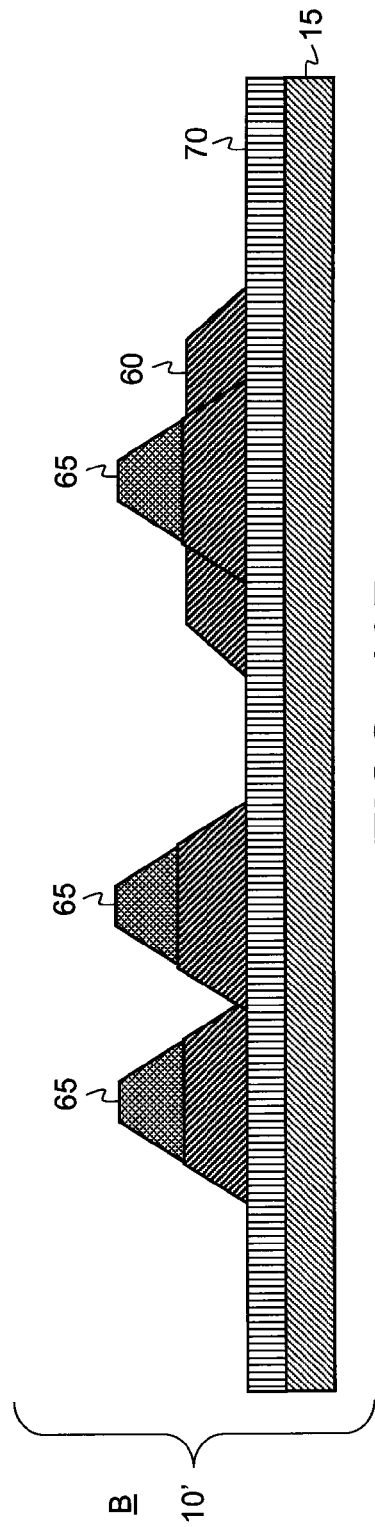
FIG. 10B is a partial cross-sectional view, not to scale, of a relief printing image of the present invention.

Referring to FIGS. 8A, 8B, 9A, and 9B, embodiments of prior art relief printing precursors include substrate 15 having thereon single radiation-sensitive layer 20, oxygen inhibition layer 35 and laser ablatable layer 30. A backside exposure to radiation ($\lambda$) is used to create relief image floor 20' in radiation-sensitive layer 20. Laser ablation is then used to create a mask by providing image areas 45 in laser ablatable layer 30 (FIG. 9A). Imaging radiation through the mask (FIG. 9B) then provide irradiated portions 50. After chemical development, prior art relief printing element 1 is provided (FIG. 10A) that is shown in contrast with relief printing element 10' (FIG. 10B) of the present invention that has an improved relief floor for the relief image.

While the embodiments of the present invention that are shown in FIGS. 1 through 7D are illustrated in the form of a flexographic printing plate precursor used to form a flexographic printing plate, the same type of elements and method steps can be used to provide flexographic printing sleeves to be put onto printing cylinders that serve as substrates, or to form flexographic printing cylinders that are coated with the necessary layers on a cylinder base that serves as a substrate. Thus, the relief printing precursors can be flexographic printing plate, sleeve, or cylinder precursors. For example, when the relief image precursor is in cylindrical form, the appropriate coatings can be laser ablated and irradiation using multiple imaging sources as the cylinder is turned at a suitable speed for the given imaging energies and apparatus. When the relief printing precursor is a printing cylinder, this invention provides the advantage that a printing element with an opaque substrate can be imaged using multiple irradiation sources in the same imaging apparatus.

The relief printing precursor may include a suitable dimensionally stable substrate upon which the radiation-sensitive layers and ablatable layer are disposed, and optionally a separation layer, oxygen barrier layer, cover sheet, or metal layer. Suitable substrates include but are not limited to, dimensionally stable polymeric films, such as polyester, polyolefin, acrylic, polycarbonates, polyamides, and cellulose acetate films known in the art, and metals such as aluminum sheets, sleeves, or cylinders. Since backside irradiation is not necessary, the substrate can also be opaque and include various papers or pigmented resins. Each or both of the first and second units used for the relief printing system can have a suitable substrate but in most embodiments, only the first unit has a substrate.

While the present invention is illustrated primarily with respect to relief printing precursors having two radiation-sensitive layers, it would be readily apparent to one skilled in the art from this teaching and the precursors could have two or more radiation-sensitive layers as long as the individual layers have sensitivity that different from the others by at least 25 nm.

The first and second radiation-sensitive layers are designed to have radiation-sensitive compositions that are sensitive to specific electromagnetic radiation. This sensitivity can cause various chemical or mechanical changes such as polymerization, crosslinking, curing, coalescence, chain scission and decomposition. As pointed out above, the first radiation-sensitive layer is generally sensitive to radiation having a first $\lambda_{max}$ of from about 250 to about 750 nm or from about 290 to about 400 nm. This is accomplished by incorporating appropriate sensitizing compounds into that layer. The second radiation-sensitive layer can be generally sensitive to radiation having a second $\lambda_{max}$ in the range of from about 250 to about 750 nm or from about 290 to about 320 nm, as long as the first and second $\lambda_{max}$ values are at least 25 nm apart. In other embodiments, the second $\lambda_{max}$ is in the range of from about 750 to about 1400 nm.

In general, each of the radiation-sensitive layers includes a curable radiation-sensitive composition (for example a UV-curable composition) that generally photopolymerizable, photocrosslinkable, or both. These compositions generally include one or more curable resins (such as a UV-curable resin) or pre-polymer or one or more polymerizable monomers, one or more photoinitiators, and one or more elastomeric resins. These compositions are curable upon exposure to the selected irradiation and the non-cured composition is soluble or dispersible in a suitable developing solvent(s). The compositions can include various addenda that are known in the art including but not limited to, plasticizers, rheology modifiers, thermal polymerization inhibitors, tackifiers, colorants, antioxidants, antioxonants, and fillers. Various radiation-sensitive compositions and components thereof are described for example in U.S. Pat. 6,238,837 (Fan) that is incorporated herein by reference and in references cited therein.

Examples of useful elastomeric binders include but are not limited to, natural or synthetic polymers of conjugated diolefin hydrocarbons including polyisoprene, polybutadienes, butadiene/acrylonitrile, butadiene/styrene thermoplastic-elastomeric block copolymers, and other copolymers known in the art for this purpose. The elastomeric binder(s) can be present in either or both of the first and second radiation-sensitive layers in the same or different amounts of at least 50 weight %.

One or more crosslinkable components in the radiation-sensitive compositions include but are not limited to, ethylenically unsaturated polymerizable compounds (monomers or oligomers) having a molecular weight of less than 30,000 such as (meth)acrylates, di(meth)acrylates, pentaerythritol di- and tri-acrylates, (meth)acrylate derivatives of isocyanates, esters, and epoxides, and others that are known in the art. It is also possible to use crosslinkable polymers such as those having free radical reactive pendant or side groups for example as described in U.S. Pat. 5,840,463 (Blanchet-Fincher). The monomer(s) is present in the first and second radiation-sensitive layers in the same or different amounts of at least 5 weight %.

The photoinitiators are compounds that are sensitive to the specific radiation and generate free-radicals that initiate polymerization of the monomer(s) without excessive termination. In many embodiments, the photoinitiators are sensitive to UV or visible radiation and should be thermally inactive at and below 185° C. Examples of useful photoinitiators of this type include but are not limited to peroxides (such as benzoyl peroxide), azo compounds (such as 2,2'-azobis(butyronitrilie)), benzoin derivatives (such as benzoin and benzoin methyl ether), derivatives of acetophenone (such as 2,2-dimethoxy-2-phenylacetophenone), ketoxime esters of benzoin, substituted and unsubstituted polynuclear quinones, triazines, 3-ketocoumarins, and biimidazoles. In other embodiments, the photoinitiators in the second radiation-sensitive layer are near-IR or IR sensitizers or catalysts including but not limited to onium salts. The photoinitiator(s) is generally present in the first and second radiation-sensitive layers in the same or different amounts of at least 0.001 weight % and typically from about 0.1 weight % to about 10 weight %.

The thickness ratio of the first radiation-sensitive layer to the second radiation-sensitive layer is at least 1:1 and up to 500:1 and typically from about 50:1 to about 300:1. Thus, the first radiation-sensitive layer generally has a thickness of from about 1000 to about 3000 μm, and the second radiation-sensitive layer generally has a thickness of from about 10 to about 150 μm, and typically from about 50 to about 75 μm.

The infrared radiation ablatable layer in the relief printing precursor is ablatable (vaporizes or decomposes) upon exposure to infrared radiation. The layer generally includes one or more compounds capable of absorbing near-infrared and infrared radiation of from about 750 to about 1400 nm and typically from about 800 to about 1250 nm, and one or more binders. This layer provides a "mask" for imaging the underlying layers and is thus opaque to the imaging radiation and has a transmission optical density of 2 or more and typically of 3 or more. The absorption feature is provided by incorporating one or more infrared radiation-absorbing compounds into the layer. Such compounds include but are not limited to carbon black and other organic or organic pigments, and infrared-absorbing dyes such as cyanine, squarylium, chalcogenopyrloarylidene, polymethine, oxyindolizine, merocyanine, metal thiolate, and quinoid dyes. These absorbing compounds can be present in any concentration that is effective for the intended purpose and typically from about 0.1 to about 30 weight %.

Useful binders for the infrared radiation ablatable layer include but are not limited to, polymers that are incompatible with underlying layers and are generally tack-free, such as polyamides, polyvinyl acetals, polyimides, polybutadienes, silicone resins, polycarbonates, polyesters, polyalkylenes, polylactones, and polyacetals. The binder(s) can be present in an amount of from about 40 to about 90 weight % and typically from about 60 to about 80 weight %.

The infrared radiation ablatable layer can also include one or more plasticizers, pigment dispersants, surfactants, adhesion modifiers, coating aids, and secondary binders such as polystyrenes, polyacrylates, polyvinylidene chloride, polyurethanes, and polyvinyl chloride.

The infrared radiation-ablatable layer generally has a thickness of less than 1 μm.

In some embodiments, an oxygen inhibition layer can be disposed between the second radiation-sensitive layer and the infrared radiation ablatable layer. This oxygen barrier layer can shield the underlying radiation-sensitive layers from atmospheric oxygen and minimize migration of materials out of those layers into the infrared radiation ablatable layer. Materials useful in such layers include but are not limited to, poly(vinylidene chloride), poly(vinyl alcohol)s, and styrene-maleic anhydride copolymers.

As noted above, curing of the first and second radiation-sensitive layers can be carried out using suitable UV or visible (or IR) imaging sources. For example, UV or visible imaging sources include carbon arcs, mercury vapor arcs, fluorescent lamps, electron flash units, sun lamps, and photographic flood lamps. IR imaging sources include laser diodes and thermal resistive heads.

Imagewise exposure to provide the mask and irradiation of the radiation-sensitive layers can be accomplished using the same or different equipment, for example using a drum upon which the relief printing precursor is mounted and rotated to allow for exposure to the different radiations.

IR ablation time can vary as described above depending upon the thickness of the infrared radiation ablatable layer, the complexity of the image, the distance from the precursor, and the nature and composition of the ablatable layer.

As described above, actinic radiation (UV to visible) exposure time can vary from a few seconds to a few minutes depending upon the intensity and spectral energy distribution of the radiation, its distance from the precursor, and the nature and amount of curable compositions in the two radiation-sensitive layers.

After all of the irradiation steps, the relief image is completed by developing or removing the non-imaged portions of the layers using a developer than dissolves, disperses, or swells the non-imaged portions so they can be removed. Suitable developers include organic solvents such as aliphatic or aromatic hydrocarbons (especially non-chlorinated hydrocarbons), long chain alcohols, or mixtures thereof. Some developers may also include some water or alkaline components. Commercial developers include those sold by DuPont as CYREL OptiSol and CYREL CyloSol developers. Examples of solvents used in developers are also described for example in U.S. Pat. No. 3,782,961 (Takahashi et al.), U.S. Pat. No. 4,517,279 (Worns), and U.S. Pat. No. 4,847,182 (Worns et al.), U.S. Pat. No. 5,354,645 (Schober et al.), U.S. Pat. No. 3,796,602 (Briney et al.), and DE 3,828,551. Solution development can be accompanied by mechanical removal means such as scrubbing, rubbing, wiping, or brushing means. Development may require a time of at least 2 and up to 20 minutes at from about 20° C. to about 35° C. and the solution can be applied by immersion, dipping, spraying, brushes, or rollers. The type of developing apparatus and specific developer that are used will dictate the specific development conditions.

If the non-imaged portions of the mask are not removable during development, a pre-development step may be used to remove those portions first, for example by using an etching solution or highly alkaline solution.

Following development, the resulting relief printing elements are generally blotted or wiped dry, and possibly dried in a forced air or infrared oven using conventional drying times and temperatures. Detackification (or light finishing for example using $\lambda_1$ and $\lambda_2$) is an optional post-development treatment that can be applied if the printing surface is still tacky. For embodiments having more than two radiation-sensitive layers, the detackification can be carried out using any or all of the wavelengths to which the layers are sensitive. A post-development curing may also be carried out if desired.

The resulting relief printing elements can be used to advantage in the formation of seamless, continuous flexographic printing elements. Flat sheets can be wrapped around a cylindrical form, usually as a printing sleeve or the printing cylinder itself and joining or taping the ends together. However, as noted above, the method of this invention can be performed while the precursor is mounted around a cylindrical form.

The resulting relief image can have a total depth of up to 2000 μm that can represent up to 100% of the original thickness of both first and second radiation-sensitive layers if the precursor comprises a substrate. If the precursor is "self-supporting" and has no separate substrate, the total depth may represent up to 60% of the original thickness of both of the radiation-sensitive layers.

The following embodiments represent some ways that the present invention could be designed and used:

Embodiment 1:

The first radiation-sensitive layer could contain Esacure KTO 46 photoinitiator at a concentration of 0.2 g/l making it sensitive to UV radiation between 360 to 400 nm. The second radiation-sensitive layer could contain Esacure KB1 at 0.01 g/l making it sensitive to UV radiation below 320 nm. The IR ablation layer could have the composition described in Table 1 of Example 1 of U.S. Pat. 7,279,254 (Zwadlo et al.) that is incorporated herein by reference.

Embodiment 2:

The first radiation-sensitive layer could contain Esacure KTO 46 photoinitiator at a concentration around 0.2 g/l making it sensitive to UV radiation between 360 to 400 nm. The second radiation-sensitive layer could contain Esacure KTO 46 at a concentration around 0.01 g/l making it sensitive to UV radiation below 340 nm. The IR ablation layer could have the composition described in Example 1 of U.S. Pat. No. 7,279,254 (noted above).

Embodiment 3:

The first radiation-sensitive layer could contain Esacure KTO 46 Photoinitiator at a concentration around 0.2 g/l making it sensitive to UV radiation between 360 to 400 nm. The second-radiation sensitive layer could contain Spectra Group H-Nu-IR-780 photoinitiator with peak sensitivity near 765 nm. The IR ablation layer could have the composition described in Table 1 of Example 1 of U.S. Pat. 7,279,254 (noted above).

Embodiment 4:

The first radiation-sensitive layer precursor 110 could have a Kodak Flexcel® NXH Plate sensitive to UV radiation up to 380 nm. The second unit 120 could contain Spectra Group H-Nu-IR-780 photoinitiator with peak sensitivity near 765 nm. Second unit 120 also could contain the IR ablation layer 135 having the composition of Table 1 of Example 1 of U.S. Pat. No. 7,279,254 (noted above). A Kodak® Trendsetter NX plate setter having a laser wavelength of 830 nm can be used to ablate the IR ablation layer to form a mask. A 765 nm light source can be used inside the plate setter to expose the second radiation-sensitive layer. The Kodak® Trendsetter NX plate setter can then be used to image the IR layer and expand mask in areas where the local floor is desired. Second unit 120 could then be laminated to first unit 110 using a Kodak NX Laminator. Resulting precursor 100 can then be exposed using a Mekrom exposure unit using UV energy below 400 nm. The IR ablation layer can be peeled off and precursor 100 less the IR layer is solvent washed out using a Mekrom processor.

Embodiment 5:

The first radiation-sensitive layer precursor 110 can have a Kodak Flexcel® NXH Plate sensitive to UV radiation up to 380 nm. Second unit 120 can contain second radiation sensitive layer that could contain Esacure KTO 46 at a concentration around 0.01 g/l making it sensitive to UV radiation below 340 nm. Second unit 120 can also contain IR ablation layer 135 having the composition described in Table 1 of Example 1 of U.S. Pat. No. 7,279,254 (noted above). A Kodak Trendsetter NX with a laser wavelength of 830 nm is used to ablate the IR layer. A UV light source with radiation contain up 350 nm light is used inside the Trendsetter to expose the second radiation-sensitive layer. A Kodak® Trendsetter NX can then be used to image the IR layer and expand areas where the local floor is desired. Second unit 120 can be laminated to first unit 110 using a Kodak® NX Laminator. First unit 100 can then be exposed using a Mekrom exposure unit using UV energy above 360 nm and below 400 nm. The IR ablation layer can be peeled apart and precursor 100 less the IR layer can be solvent washed out using a Mekrom processor.

The invention has been described in detail with particular reference to certain preferred embodiments thereof, but it will be understood that variations and modifications can be effected within the spirit and scope of the invention.

The invention claimed is:

1. A method of making a relief printing image comprising:
providing a relief printing precursor that is a flexographic printing precursor that is in the form of a flexographic printing plate, sleeve, or cylinder precursor, the relief printing precursor comprising at least:
- a first radiation-sensitive layer that comprises a radiation-sensitive composition that is sensitive to and curable by a first imaging radiation comprising a first $\lambda_{max}$,
- a second radiation-sensitive layer disposed on said first radiation-sensitive layer, wherein said second radiation-sensitive layer that comprises a radiation-sensitive composition is sensitive to and curable by a second imaging radiation comprising a second $\lambda_{max}$ that differs from said first $\lambda_{max}$ by at least 25 nm, wherein the second radiation-sensitive layer is insensitive to the first imaging radiation comprising a first $\lambda_{max}$, and
- an infrared radiation ablatable layer disposed on said second radiation-sensitive layer, said ablatable layer being opaque to said first and second imaging radiations and comprising an infrared radiation absorbing compound, imagewise exposing the relief printing precursor to infrared radiation ablative energy to form a mask image in the infrared radiation ablatable layer,
subsequently or simultaneously with the imagewise exposing, exposing the relief printing precursor to a second imaging radiation through the mask image,
modifying the mask image using additional infrared radiation ablative energy to form a modified mask image, and
subsequently exposing the relief printing precursor to a first imaging radiation through the modified mask image.

2. The method of claim 1 wherein the relief printing precursor is self-supporting and wherein one of the radiation-sensitive layers is capable of being cured to provide a substrate.

3. The method of claim 2 wherein the first $\lambda_{max}$ is from about 250 to about 750 nm, and the second $\lambda_{max}$ is from about 250 to about 750 nm.

4. The method of claim 1 wherein the first $\lambda_{max}$ is from about 250 to about 750 nm, and the second $\lambda_{max}$ is from about 750 to about 1400 nm.

5. The method of claim 1 wherein the first $\lambda_{max}$ is from about 290 nm to about 400 nm, and the second $\lambda_{max}$ is from about 290 to about 320 nm.

6. The method of claim 1 wherein the second radiation-sensitive layer is also transparent to the first imaging radiation.

7. The method of claim 2 wherein the relief printing precursor is a flexographic printing sleeve precursor.

8. The method of claim 1 wherein the first radiation-sensitive layer is disposed on a substrate.

9. The method of claim 1 wherein the relief printing precursor is a coated flexographic printing cylinder precursor.

10. The method of claim 1 wherein the relief printing precursor is a self-supporting flexographic printing plate precursor.

11. The method of claim 1 wherein the thickness ratio of the first radiation-sensitive layer to the second radiation-sensitive layer is at least 1:1 and up to 300:1.

12. The method of claim 1 wherein the first radiation-sensitive layer and the second radiation-sensitive layer comprise a UV-curable composition comprising a UV-curable component, a photoinitiator, and an elastomeric resin.

13. The method of claim 1, wherein:
providing the relief printing precursor is by laminating the first radiation-sensitive layer as a first unit to the second unit comprising the second radiation-sensitive layer and the infrared radiation ablatable layer.

14. The method of claim 13 wherein the second unit further comprises a peelable protective layer that is peeled off before laminating the first and second units.

* * * * *